US006867601B2

(12) United States Patent
Morimoto

(10) Patent No.: US 6,867,601 B2
(45) Date of Patent: Mar. 15, 2005

(54) CAPACITANCE TYPE SENSOR

(75) Inventor: Hideo Morimoto, Yamatokohriyama (JP)

(73) Assignee: Nitta Corporation, Osaka (JP)

( * ) Notice: Subject to any disclaimer, the term of this patent is extended or adjusted under 35 U.S.C. 154(b) by 0 days.

(21) Appl. No.: 10/616,352

(22) Filed: Jul. 9, 2003

(65) Prior Publication Data

US 2004/0008039 A1 Jan. 15, 2004

(30) Foreign Application Priority Data

Jul. 11, 2002 (JP) ........................................ 2002-202380

(51) Int. Cl.[7] ............................................. G01R 27/26
(52) U.S. Cl. ..................... 324/661; 324/660; 73/514.32
(58) Field of Search ................................ 324/658–662, 324/686; 73/514.32

(56) References Cited

U.S. PATENT DOCUMENTS 6,373,265 B1 * 4/2002 Morimoto et al. .......... 324/686

* cited by examiner

Primary Examiner—Vincent Q. Nguyen
(74) Attorney, Agent, or Firm—Osha & May L.L.P.

(57) ABSTRACT

A sensor unit having capacitance element electrodes and a displacement electrode being opposite thereto is disposed on a substrate. A detective button is supported onto the substrate in such a manner that the detective button is positioned above the sensor unit to define a specified space between the supporting member for supporting the detective button and the displacement electrode.

15 Claims, 13 Drawing Sheets

CAPACITANCE TYPE SENSOR

BACKGROUND OF THE INVENTION

1. Field of the Invention

The present invention relates to a capacitance type sensor suitably used for detecting a force applied from outside.

2. Description of the Related Art

A capacitance type sensor is in general use as a device for converting magnitude and direction of a force applied by an operator into electric signal. For example, a device having the capacitance type sensor for inputting operation of multidimensional direction incorporated as a so-called joystick is used as an input device of a mobile phone.

A capacitance type sensor can be used to input an operation having a specified dynamic range as a magnitude of a force applied by an operator. It can also be used as a 2-dimensional or 3-dimensional sensor capable of dividing an applied force into all dimensional components, for force detection. Among others, a capacitance type force sensor having a capacitance element formed by two electrodes to detect an applied force on the basis of changes of capacitance values caused by variations of distance between the electrodes is now in practical use in a variety of fields in terms of the merit that the structure can be simplified to reduce costs.

Reference is herein made for example to International Application No. PCT/JP00/09355 under the Patent Cooperation Treaty filed on Dec. 27, 2000 by the same applicant. It describes a capacitance type sensor 501 as shown in FIG. 13. The capacitance type sensor 501 has a substrate 520, a detective member 530 which is an operating member to which a force is applied from outside by a user, a displacement electrode 512 having conducting properties, capacitance element electrodes E501–E505 and a reference electrode (a common electrode) E500 formed on the substrate 520, an insulating film 513 formed to be laid over the substrate 520 so as to be closely contacted with the capacitance element electrodes E501–E505 and the reference electrode E500, and a supporting member 560 for fixedly supporting the detective member 530 and the displacement electrode 512 on the substrate 520.

As shown in FIG. 14, the capacitance element E505 of a circular form with center at the origin O, the capacitance element electrodes E501–E504 of a sector form arranged around it, and the reference electrode E500 of an annular form with center at the origin O arranged further around them are formed on the substrate 520. The capacitance element is formed between the displacement electrode 512 and the respective capacitance element electrode E501–E505.

In this capacitance type sensor 501, signals such as clock signals are input to the capacitance element electrodes E501–E505. When the detective member 530 is displaced by a force applied from outside in the condition in which the signals are being input to the capacitance element electrodes E501–E505, the displacement electrode 512 is displaced in a Z-axis direction in response to the displacement. Then, the distances between the electrodes of the capacitance elements formed between the displacement electrode 512 and the respective capacitance element electrodes E501–E505 vary and thereby the capacitance value of those capacitance elements change as the variations of the distance between the electrodes, to thereby produce a phase lag in the signals input to the capacitance element electrodes E501–E505. By using this phase lag in the input signals, the displacement of the detective member 530, i.e., the magnitude and direction of the force applied from outside to the detective member 530 in directions of X-axis, Y-axis, and Z-axis, are detected.

However, since the capacitance type sensor 501 is constructed so that the detective member 530 and the displacement electrode 512 are in contact with each other (integral with each other), when the detective member 530 is displaced, the displacement electrode 512 is also displaced automatically. Due to this, if a returned position of the detective member 530 after operation differs from an initial position of the same before operation, the returned position of the displacement electrode 512 will also vary. As a result, the output signals from the capacitance type sensor 501 before operating the detective member 530 and those from the same sensor after operating the detective member 530 vary. This results in increase in hysteresis of output signal from the capacitance type sensor 501 and thus reduction in reproducibility as the sensor. Also, if the detective member 530 is displaced only a little against will of an operator, then the displacement electrode 512 will also be displaced automatically to easily introduce errors (malfunctions) of the sensor.

SUMMARY OF THE INVENTION

It is an object of the present invention to provide a capacitance type sensor capable of providing improved reproducibility.

It is another object of the present invention to provide a capacitance type sensor capable of suppressing occurrence of errors of the sensor.

In accordance with the first aspect of the present invention, there is provided a capacitance type sensor comprising a detective member, a first electrode being opposite to the detective member, and a second electrode arranged between the detective member and the first electrode and constituting capacitance elements with the first electrode, the second electrode being displaceable in a same direction as the detective member when the detective member is displaced, wherein a specified space is defined between the detective member and the second electrode, whereby the second electrode is not displaced until the detective member is displaced to an extent corresponding to the specified space, and wherein the capacitance type sensor is capable of recognizing the displacement of the detective member on the basis of a detection, using a signal input to the first electrode, of a change in capacitance value of the capacitance element caused by a change in distance between the first electrode and the second electrode.

According to this construction, since a specified space is defined between the detective member and the second electrode, the second electrode is not displaced until the detective member is displaced to an extent corresponding to the specified space. Accordingly, even if there is difference between an initial position of the detective member before operation and a returned position of the same after operation, a possible occurrence of difference of the returned position of the second electrode from the original position of the same is prevented. Therefore, the out put signal from the capacitance type sensor before operation of the detective member and the output signal from the capacitance type sensor after operation of the detective member become substantially the same. This can provide a relatively reduced hysteresis of the output signal from the capacitance type sensor, thus providing improved reproducibility for the sensor. In addition, since the second electrode is not displaced until the detective member is pressed down (displaced) to an extent corresponding to the specified space by an operator's will, occurrence of errors (malfunctions) of the sensor is suppressed.

The expression that "displacement of the detective member can be sensed" has substantially the same meaning as the expression that "a force applied to the detective member from outside"; The expression that "a specified space is defined between the detective member and the second electrode" is intended to mean that the space defined may be somewhere between the both. For example, in addition to the arrangement wherein the space is defined between the detective member and the second electrode without any additional member being interposed therebetween, another arrangement wherein the supporting member for supporting the detective member is interposed between the detective member and the second electrode and the space is formed between the supporting member and the second electrode may be adopted.

The capacitance type sensor of the present invention may have tapered pressing members disposed in the specified space. According to this construction, when the detective member is operated, the specific portion of the second electrode can be displaced intensively to effectively change the intervals between the first electrode and the second electrode.

The capacitance type sensor of the present invention further comprises a single substrate on which the first electrode and the second electrode are both provided. According to this construction, by arranging the first electrode and the second electrode on the single substrate, the sensor part can be assembled with the detective member after the sensor part is formed as a unit (unitized). Therefore, even when the detective member (keypad) is modified in shape and size, the capacitance property of the capacitance element does not substantially vary depending on an operating force applied to the detective member. This can provide the following advantage for the case of the capacitance type sensor placed on equipment such as a mobile phone. That is to say, even when an external appearance (design) of the sensor or a shape of the detective member is modified, since the sensor part formed as a unit is commonly used, there is no need to readjust the control circuit and software in consideration of the user-friendly operation of the joystick each time that equipment is remodeled.

Also, since the sensor part is formed as a unit, the performance of the sensor part itself can be checked in advance of the assembly of the sensor part with other parts being completed. This can allow the sensor part having the capacitance values of a specified range (conforming article) to be selected by checking the capacitance elements in the sensor part in advance on the magnitude of the capacitance values and the like for each unit. As a result, generation of defective products for the sensor can be prevented, thus producing improved yield of the sensor.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

In the following, a certain preferred embodiment of the present invention is described with reference to the accompanying drawings.

Figure 1:
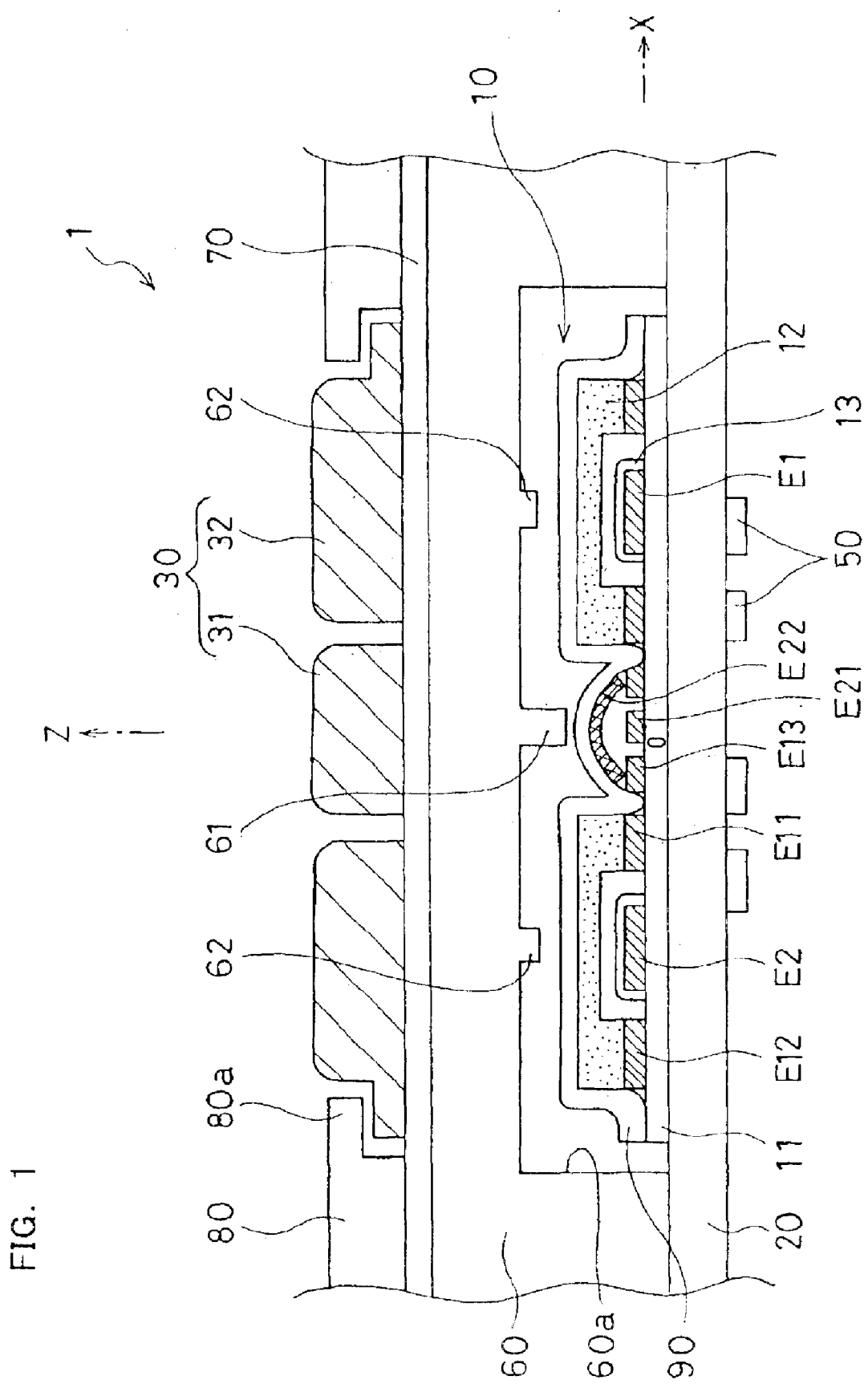
FIG. 1 is a schematic sectional view of a capacitance type sensor according to the present invention.
Figure 2:
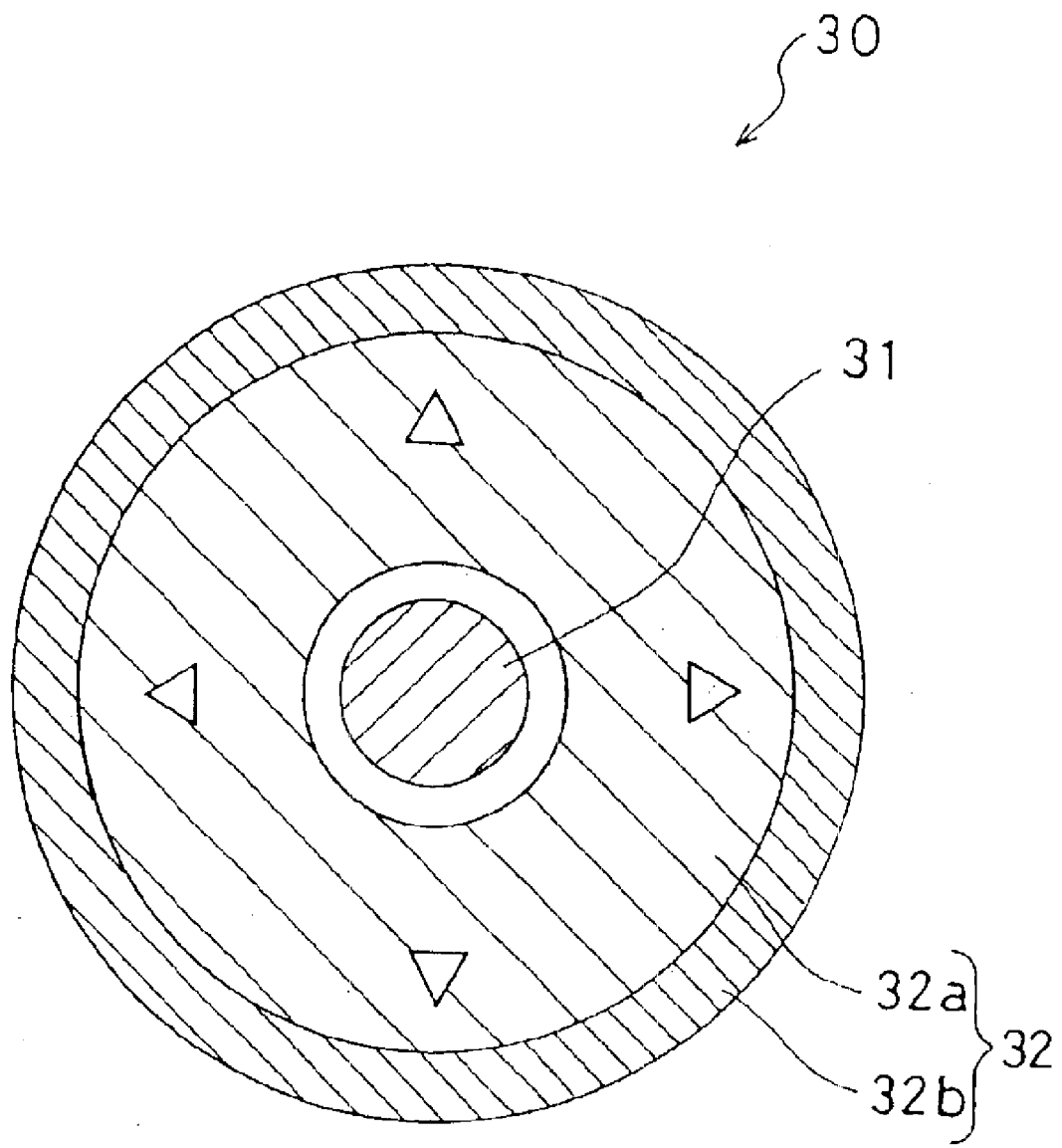
FIG. 2 is a top view of a detective member of the capacitance type sensor of FIG. 1.

First, the construction of a capacitance type sensor 1 according to the embodiment of the present invention is described with reference to the drawings. FIG. 1 is a schematic sectional view of a capacitance type sensor according to the present invention. FIG. 2 is a top view of a detective member of the capacitance type sensor of FIG. 1.

The capacitance type sensor 1 has a sensor unit 10, a substrate 20, a detective button 30 to which a force is applied from outside by an operator, a supporting member 60 for fixedly supporting the detective button 30 to the substrate 20, a resin sheet 70 arranged between the detective button 30 and the supporting member 60, and a cover case 80.

The sensor unit 10 has a flexible printed circuit board (FPC) 11, a displacement electrode 12, capacitance element electrodes E1–E4 formed on the FPC 11 (only E1 and E2 are shown in FIG. 1), reference electrodes (common electrodes) E11–E13, a fixed decision switch electrode E21, a movable decision switch electrode E22, an insulating film (resist film) 13 laid over the FPC 11 to be closely contacted with the capacitance element electrodes E1–E4, and a resin sheet (cover layer) 90 placed over the FPC 11 to be in intimate contact with the displacement electrode 12 and the movable decision switch electrode E22.

For convenience of explanation, a XYZ three-dimensional coordinate system is defined herein, as illustrated, and the placement of the parts will be described with reference to this coordinate system. That is to say, in FIG. 1, the origin O is defined at the center of the fixed decision switch electrode E21 on the FPC 11 of the sensor unit 10, letting the X-axis be in a horizontally rightward direction, the Z-axis be in a vertically upward direction, and the Y-axis be in a depth direction orthogonal to the vertical direction, when viewed from the paper. Therefore, a surface of the FPC 11 defines a plane XY, and the Z-axis passes center positions of the movable decision switch electrode E22 and detective button 30 arranged over the FPC 11.

The substrate 20 is a printed circuit board for an electronic circuit of a general type. In the illustrated example, a glass-epoxy substrate is used as the substrate. Although a film substrate formed, for example, of a polyimide film may be used as the substrate 20, since it has a nature of flexibility, it is preferably used in combination with a supporting board having sufficient rigidity on which the film substrate is placed. In the illustrated embodiment, the substrate 20 has a sensor circuit (electronic circuit) mentioned later arranged on a front side thereof and sensor circuit parts 50 arranged on a back side thereof.

The supporting member 60 is a flat-plate-like member formed, for example, of flexible material such as silicon rubber. The supporting member 60 has, in a lower surface thereof, a generally rectangular recessed portion 60a larger than the sensor unit 10 and opening downwardly. The supporting member 60 is placed on the substrate 20 in such a relation that all areas of the supporting member 60 except the recessed portion 60a formed in the lower surface are in contact with the substrate 20.

The supporting member 60 has a tapered protrusion 61 formed on a bottom of the recessed portion 60a at a position corresponding to the fixed decision switch electrode E21. It also has tapered protrusions 62 formed on the bottom of the recessed portion 60a at positions corresponding to the capacitance element electrodes E1–E4, respectively. When no operation is taken to the detective button 30, specified spaces are formed between front ends of the protrusions 61, 62 and the resin sheet 90 laid over the displacement electrode 12. The cover case 80 is a member formed, for example, of resin and is laid on an upper surface of the resin sheet to cover around the detective button 30.

In the illustrated embodiment, since the supporting member 60 is constructed to form the protrusions 61, 62 at the specified positions mentioned above, the specific portions of the movable decision switch electrode E22 and the displacement electrode 12 can be displaced effectively. It should be noted that the protrusions 61, 62 are not indispensable.

The defective button 30 consists of a central button 31 of a circular form with center at the Z-axis and a direction button 32 of an annular form arranged around the central button 31. The central button 31 has a diameter slightly larger than an outer diameter of the reference electrode E13. The direction button 32 consists of an upper portion 32a having a small diameter serving as a force receiving portion and a lower portion 32b having a large diameter and extending outwardly from around a lower end of the upper portion 32a, as shown in FIG. 2. The outer diameter of the upper portion 32a is substantially equal to that of the reference electrode E12, and the outer diameter of the lower portion 32b is larger than that of the reference electrode E12. The central button 31 and the direction button 32 are preferably formed to be separate from each other, but they may be formed in one united body.

The central button 31 is fixed, by adhesive bonding, to an upper surface of the resin sheet 70 on the supporting member 60 in such a relation that it corresponds in position to the fixed decision switch electrode E21, movable decision switch electrode E22 and reference electrode E13. The direction button 32 is set in place on the upper surface of the resin sheet 70 via a retaining structure, with the lower portion 32b of the direction button 32 retained by a holding portion 80a of a part of the cover case 80 in such a relation that the direction button 32 corresponds in position to the capacitance element electrodes E1–E4. Thus, since the outer diameter of the direction button 32 is made larger than a diameter of a circle formed by a tip end of the holding portion 80a of the cover case 80, the direction button 32 is prevented from falling out from the cover case 80. The direction button 32 may be fixed to the upper surface of the resin sheet 70 by adhesive bonding. Also, the central button 31 and the resin sheet 70 may be molded in one piece.

As shown in FIG. 2, the upper portion 32a of the direction button 32 has, on an upper surface thereof, arrows to indicate operating directions (moving directions of a cursor) which are formed so that the arrows correspond to the X-axis positive direction and negative direction and the Y-axis positive direction and negative direction, respectively, or correspond to the capacitance element electrodes E1–E4, respectively.

The substrate 20, the supporting member 60, the resin sheet 70, and the cover case 80 are fixed to keep them together by tightening setscrews (not shown) inserted into through holes (not shown) formed in those members and their respective nuts (not shown).

Figure 3:
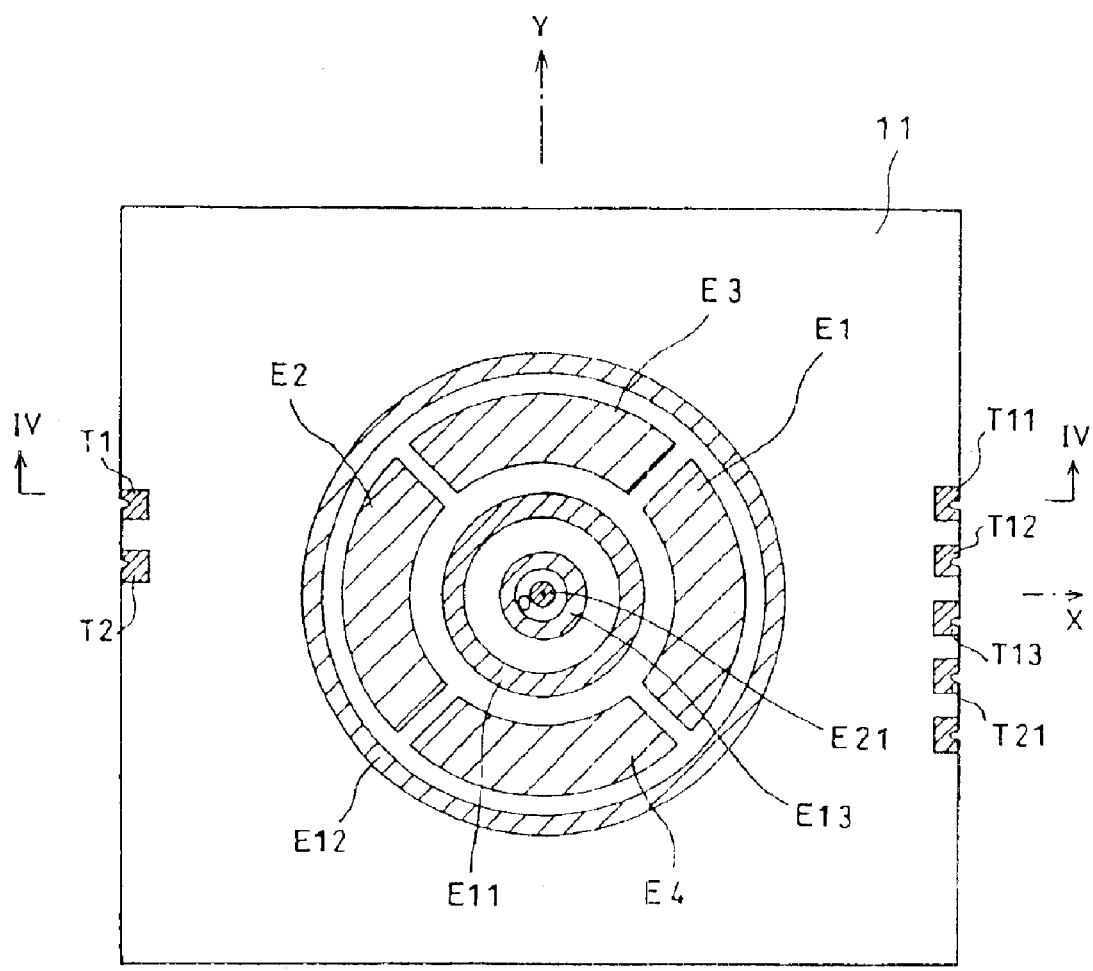
FIG. 3 is a view showing an arrangement of a plurality of electrodes formed on FPC of the capacitance type sensor of FIG. 1.
Figure 4:
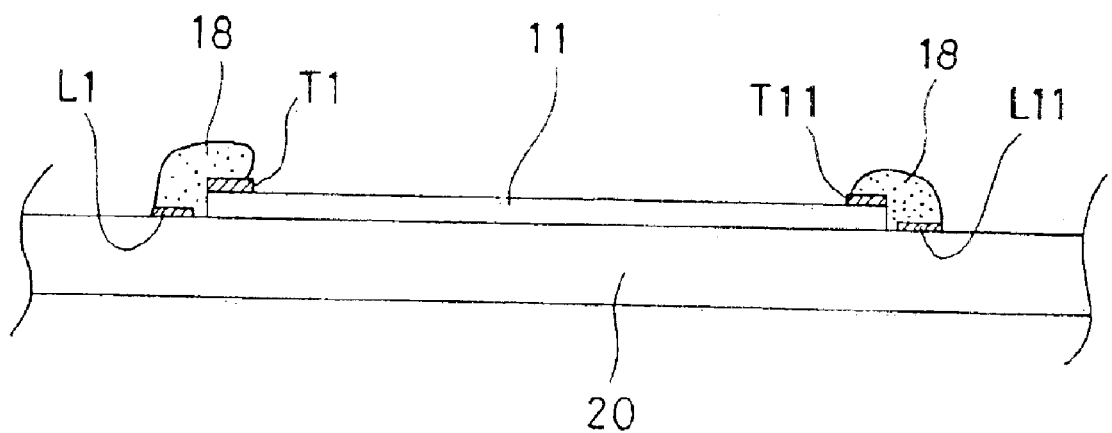
FIG. 4 is a view showing an arrangement of FPC on a substrate.
Figure 5:
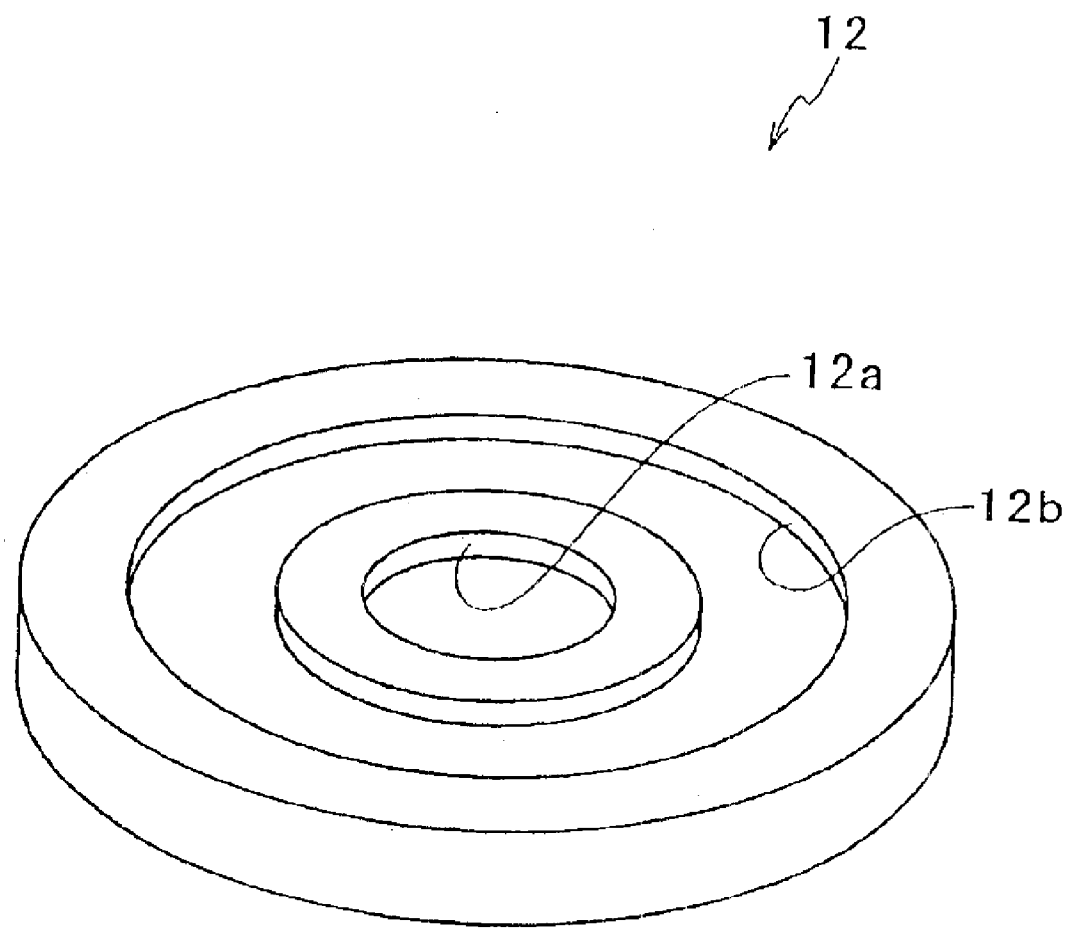
FIG. 5 is a view showing a schematic configuration of a displacement electrode.

Now, reference is made to the construction of the sensor unit 10 built in the capacitance type sensor 1 according to the embodiment of the invention with reference to the drawings. FIG. 3 is a view showing an arrangement of a plurality of electrodes formed on FPC of the capacitance type sensor of FIG. 1. FIG. 4 is a view showing an arrangement of FPC on the substrate. FIG. 5 is a view showing a schematic configuration of the displacement electrode.

In the sensor unit 10, a number of electrodes, such as the capacitance element electrodes E1–E4 and the displacement electrodes 12, are formed as a unit on an upper surface of the generally rectangular FPC 11, as shown in FIGS. 1 and 3. Also, the sensor unit 10 is adhesive bonded to the substrate 20 in such a relation that the lower surface of FPC 11 are in contact with the upper surface of the substrate 20 and also the sensor unit 10 is placed in the recessed portion 60a of the supporting member 60. In the adhesive bonding, the sensor unit 10 can be handled with ease, since the FPC 11 has flexibility. A thin substrate having no flexibility may be used as a substitute for the FPC 11 of the sensor unit 10.

As shown in FIG. 3, the fixed decision switch electrode E21 of a circular form with center at the origin O, the reference electrode E13 of an annular form arranged around the fixed decision switch electrode E21, the reference electrode E11 of an annular form arranged around the reference electrode E13, the capacitance element electrodes E1–E4 of a sector form arranged around the reference electrode E11, and the reference electrode E12 of an annular form arranged around the capacitance element electrodes E1–E4 are formed on the FPC 11.

The capacitance element electrode E1 is arranged to correspond to the X-axis positive direction, and the capacitance element electrode E2 is arranged to correspond to the X-axis negative direction. The E1 and E2 are used for detecting components of a force applied from outside for the X-axis direction. The capacitance element electrode E3 is arranged to correspond to the Y-axis positive direction, and the capacitance element electrode E4 is arranged to correspond to the Y-axis negative direction. The E3 and E4 are used for detecting components of a force applied from outside for the Y-axis direction. The fixed decision switch electrode E21 arranged on the origin O is used for operation for decision, such as operation of input, together with the movable decision switch electrode E22.

A pair of capacitance element electrodes E1 and E2 are arranged in isolation with respect to the X-axis direction so as to be symmetric with respect to the Y-axis. A pair of capacitance element electrodes E3 and E4 are arranged in isolation with respect to the Y-axis direction so as to be symmetric with respect to the X-axis.

The displacement electrode 12 as shown in FIG. 5 is disposed over the FPC 11. For better understanding of the configuration of the back side of the displacement electrode 12 shown in FIG. 1, FIG. 5 shows the back side of the displacement electrode 12 by turning it upside down (by turning it over). The displacement electrode 12 is a metal member having a disk-like form having an outer diameter substantially equal to an outer diameter of the reference electrode E12. It has a through hole 12a formed in a center position thereof and having an outer diameter substantially equal to an inner diameter of the reference electrode E11. It also has an annular groove 12b formed in the back side thereof (upper surface as viewed in FIG. 5) and having an inner diameter substantially equal to an outer diameter of the reference electrode E11 and having an outer diameter substantially equal to an inner diameter of the reference electrode E12.

The displacement electrode 12 may be formed, for example, from conductive plastic, conductive rubber such as silicon rubber, and conductive thermosetting resin (PPT, elastomer), as well as metal. In the illustrated embodiment, the through hole 12a and the groove 12b of the displacement electrode 12 are formed by etching a single metal plate and the like. The through hole 12a and the groove 12b of the displacement electrode 12 may be formed in the condition that a plurality of annular metal plates are layered. The displacement electrode 12 may be formed by pressing a thin metal plate into a dome shape. It may also be formed of the FPC having flexibility.

When the displacement electrode 12 is placed by adhesion in such a relation that the center position of the through hole 12a corresponds to the Z-axis and also the back side of the displacement electrode 12 faces the FPC 11, the back side of the displacement electrode 12 is brought into contact with the reference electrode E11 at a portion thereof extending inward from the groove 12b and also is brought into contact with the reference electrode E12 at a portion thereof extending outward from the groove 12b.

Then, a space substantially equal to a depth of the groove 12b is defined between the capacitance element electrodes E1–E4 on the FPC 11 and the bottom of the groove 12b in the back side of the displacement electrode 12. In the illustrated embodiment, the space defined between the capacitance element electrodes E1–E4 and the bottom of the groove 12b is slightly smaller than the depth of the groove 12b, since the insulating film 13 is laid over the capacitance element electrodes E1–E4.

As a result, capacitance elements C1–C4 are formed between the displacement electrode 12 and the capacitance element electrodes E1–E4, as mentioned later. When an operating force is applied to the direction button 32, the space between the displacement electrode 12 and the capacitance element electrodes E11–E4 is narrowed. When the force applied to the direction button 32 is released, the space is restored to its original state. Therefore, the capacitance elements C1–C4 can all be considered as variable capacitance elements.

The movable decision switch electrode E22 of a dome-like form is disposed above and around the center position of the FPC 11 in such a relation that it is contacted with the reference electrode E13 but spaced apart from the fixed decision switch E21, while covering those electrodes. When the central button 31 is operated to apply a downward force to the movable decision switch electrode E22 proximity of its top, the movable decision switch electrode E22 is elastically deformed, with a tactile feel given to the operator, to be brought into contact with the fixed decision switch electrode E21. As a result, the fixed decision switch electrode E21 and the reference electrode E13 are electrically connected with each other via the movable decision switch electrode E22, and as such can allow those electrodes to be used as switch by detecting the presence or absence of the electrical connection between the both.

After having been placed in the relation as mentioned above, the displacement electrode 12 and the movable decision switch electrode E22 are fixed to the upper surface of the FPC 11 by the thin resin sheet 90 of a generally circular form being laid over the entire upper surfaces of the displacement electrode 12 and movable decision switch electrode E22 by adhesion. Since adhesive is applied to the resin sheet 90, the displacement electrode 12 and the movable decision switch electrode E22 can be fixed to the FPC 11 by pressing the resin sheet.

The displacement electrode 12 and the movable decision switch electrode E22 may alternatively be fixed to the FPC 11 by conductive adhesive, rather than by the adhesive-applied resin sheet 90 used in the illustrated embodiment.

A plurality of cutouts are formed in the FPC 11 in proximity of its ends in the X-axis positive direction and the X-axis negative direction, and a group of terminals consisting of electrodes are arranged around those cutouts. In the illustrated embodiment, the group of terminals includes six terminals T1, T2, T11–T13, and T21. Only these terminals are shown in FIG. 3. Each of the terminals is used as a connection land. The capacitance element electrodes E1–E4, the reference electrodes E11–E13, and the fixed decision switch electrode E21 are connected to the terminals T1, T2, T11–T13 and T21, respectively, by lead wires (not shown) (See FIG. 6).

On the other hand, a plurality of connection electrodes are arranged on the substrate 20 in proximity of an outer edge of a sensor unit 10 placement area, in such a relation as to correspond to their respective terminals on the FPC 11, as shown in FIG. 4. Each of the connection electrodes is used as a connection land. Only those corresponding to the terminals T1 and T11 of the plurality of connection electrodes are shown in FIG. 4.

Accordingly, when conductive solders 18 are put between the terminal T1 and the connecting electrode L1 and between the terminal T11 and the connecting electrode L11 after the sensor unit 10 is disposed on the substrate 20, as shown in FIG. 4, the electrical and mechanical connection is formed therebetween. By putting the solders between the other terminals than T1 and T11 on the FPC 11 and their respective connection electrodes, as is the case with the terminals T1 and T11, the electrical and mechanical connection is formed therebetween. The materials that may be used for connecting the terminals on the FPC 11 and the connection electrodes on the substrate 20 include, for example, conductive adhesive, in addition to the solder.

The capacitance element electrodes E1–E4, the reference electrodes E11–E13, and the fixed decision switch electrode E21 are connected to a sensor circuit or equivalent arranged on the substrate 20 through the respective terminals T1, T2, T11–T13, and T21, as mentioned later. In the illustrated embodiment, the reference electrodes E11–E13 are connected to ground through the terminals T11–T13.

The insulating film 13 laid over the capacitance element electrodes E1–E4 closely to cover them as mentioned above prevents the capacitance element electrodes E1–E4 formed from copper and the like from being exposed to air and, accordingly, it has the function of preventing oxidization of those capacitance element electrodes. Alternative anti-oxidization measurement such as gold plate may be given to the capacitance element electrodes E1–E4. Also, the insulating film 13 has the capability of preventing malfunction of the sensor caused by the direct contact between the capacitance element electrodes E1–E4 and the displacement electrode 12.

When the metal member having sufficient flexibility and elasticity is used as the displacement electrode 12, as in the illustrated embodiment, possible occurrence of the out-of-position of the displacement electrode 12 between its returned position and its initial position is effectively prevented, even if there is difference between an initial position of the detective button 30 before operation and a returned position of the same after operation. From this viewpoint, the displacement electrode 12 is preferably formed from material selected in consideration of position reproducibility. This can easily avoid occurrence of a practical problem resulting from the difference of the returned position of the displacement electrode 12 from the original position of the same.

There are many limitations imposed on the detective button 30 for providing an improved quality for product, including design, material, mounting way and fixing way. Accordingly, there are difficulties in designing the detective button by giving priority to the positional reproducibility. According to the capacitance type sensor 1 of the present invention, a sensor part serving as the sensor and the operation button are separated from each other, thus resulting in realization of the originally intended performance of the sensor.

Figure 6:
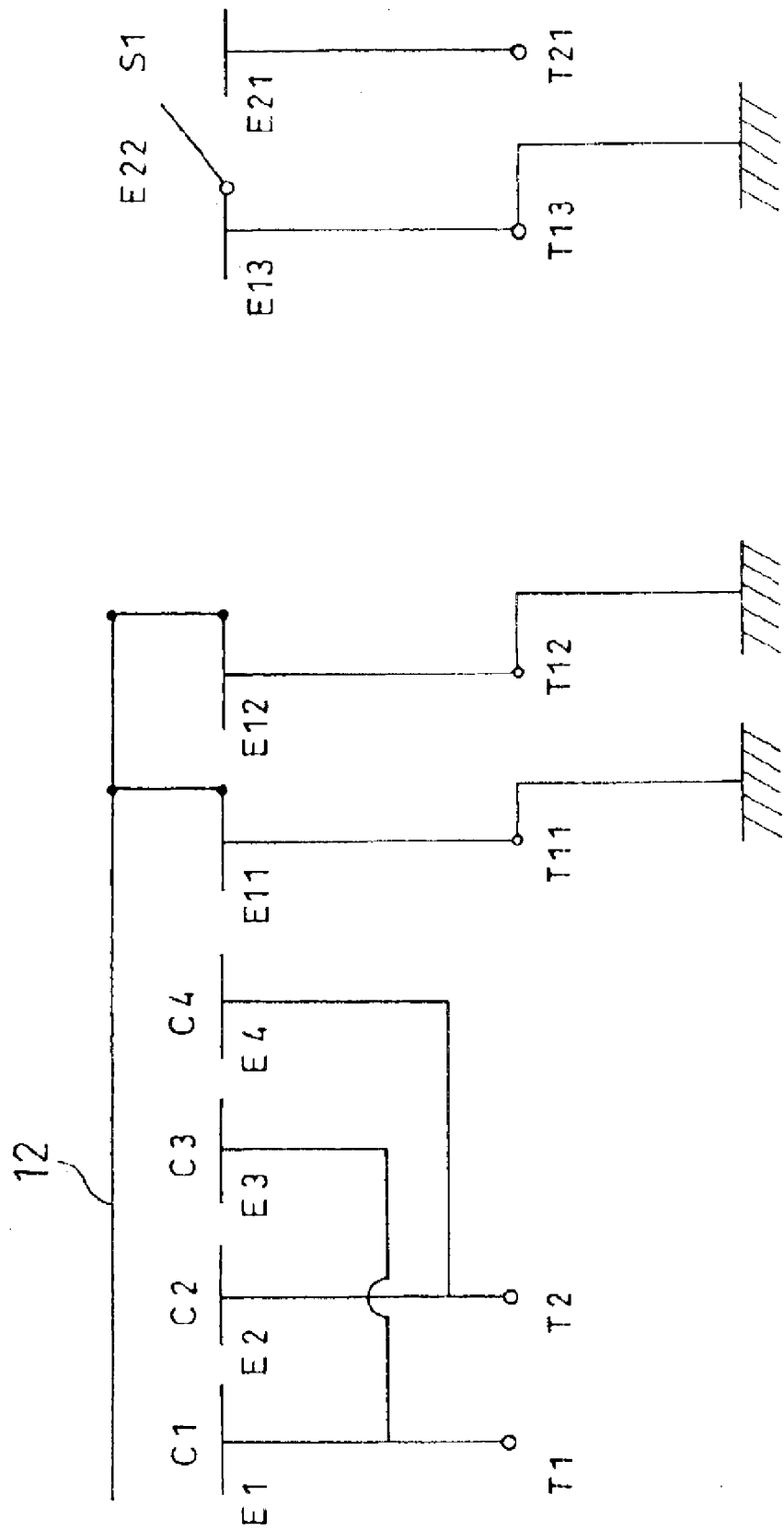
FIG. 6 is an equivalent circuit diagram for the construction of the capacitance type sensor shown in FIG. 1.

Reference is now made to the circuitry of the capacitance type sensor 1 with reference to FIG. 6. FIG. 6 is an equivalent circuit diagram for the construction of the capacitance type sensor shown in FIG. 1.

In the capacitance type sensor 1, the capacitance elements C1–C4 formed by the displaceable displacement electrode 12 that is the common electrode and the individual fixed capacitance element electrodes E1–E4 are formed between the displacement electrode 12 and the capacitance element electrodes E1–E4 on the FPC 11. It can be said that the capacitance elements C1–C4 are variable capacitance elements that are each constructed to vary in capacitance value by the displacement of the displacement electrode 12.

A decision switch S1 is formed between the reference electrode E13 and the fixed decision switch electrode E21. That is to say, the movable decision switch electrode E22 contacting with the reference electrode E13 is constructed so that it can select either of the contact mode with the fixed decision switch electrode E21 (ON mode) and the non-contact mode therewith (OFF mode).

In the illustrated embodiment, the reference electrodes E11 and E12 are connected to ground and are connected with the displacement electrode 12. This means that the displacement electrode 12 is connected to ground through the reference electrodes E11, E12 and the terminals T21, T22.

Figure 7:
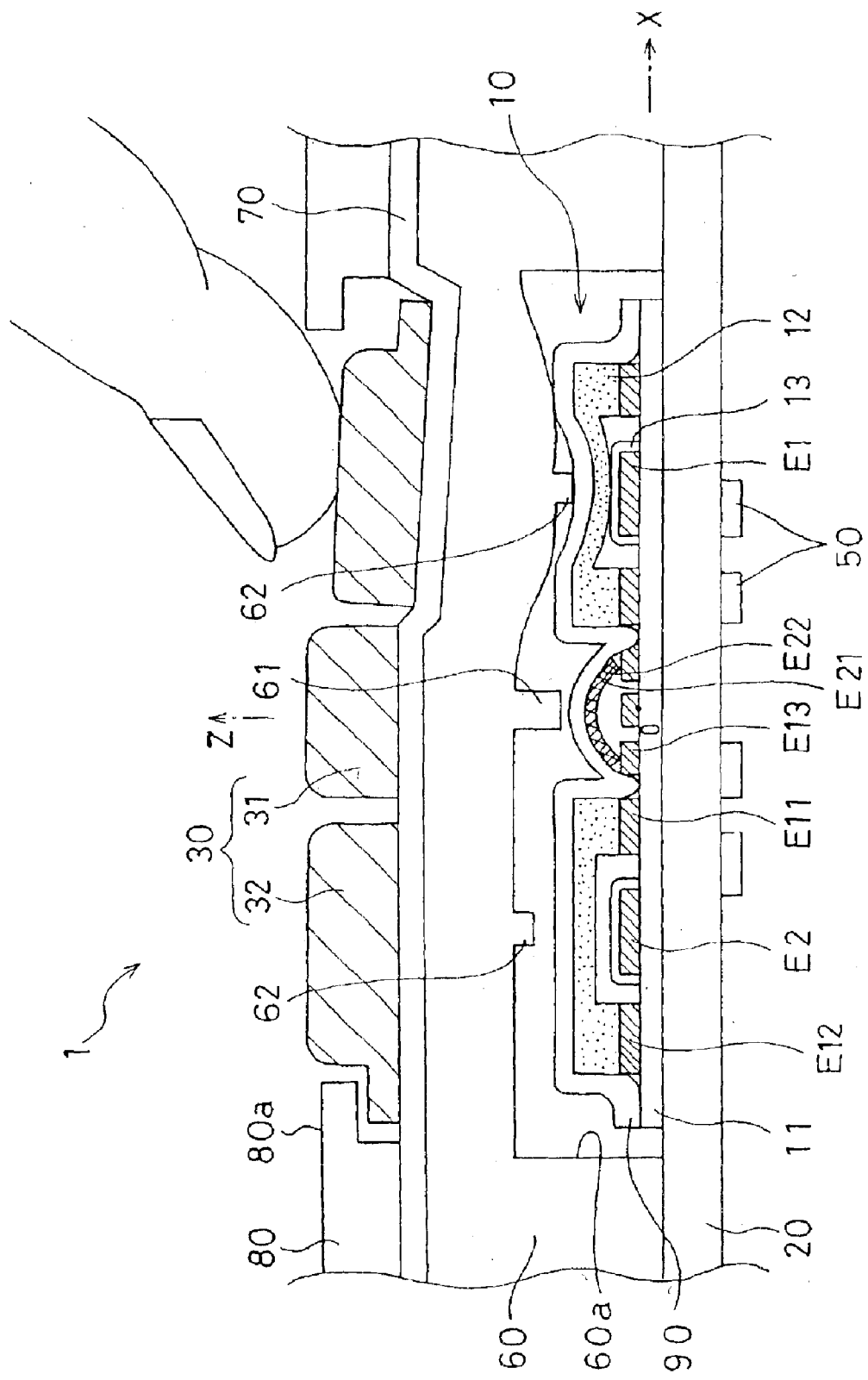
FIG. 7 is a schematic cross-sectional side view of the capacitance type sensor shown in FIG. 1 when a direction button is operated in an X-axis positive direction.
Figure 8:
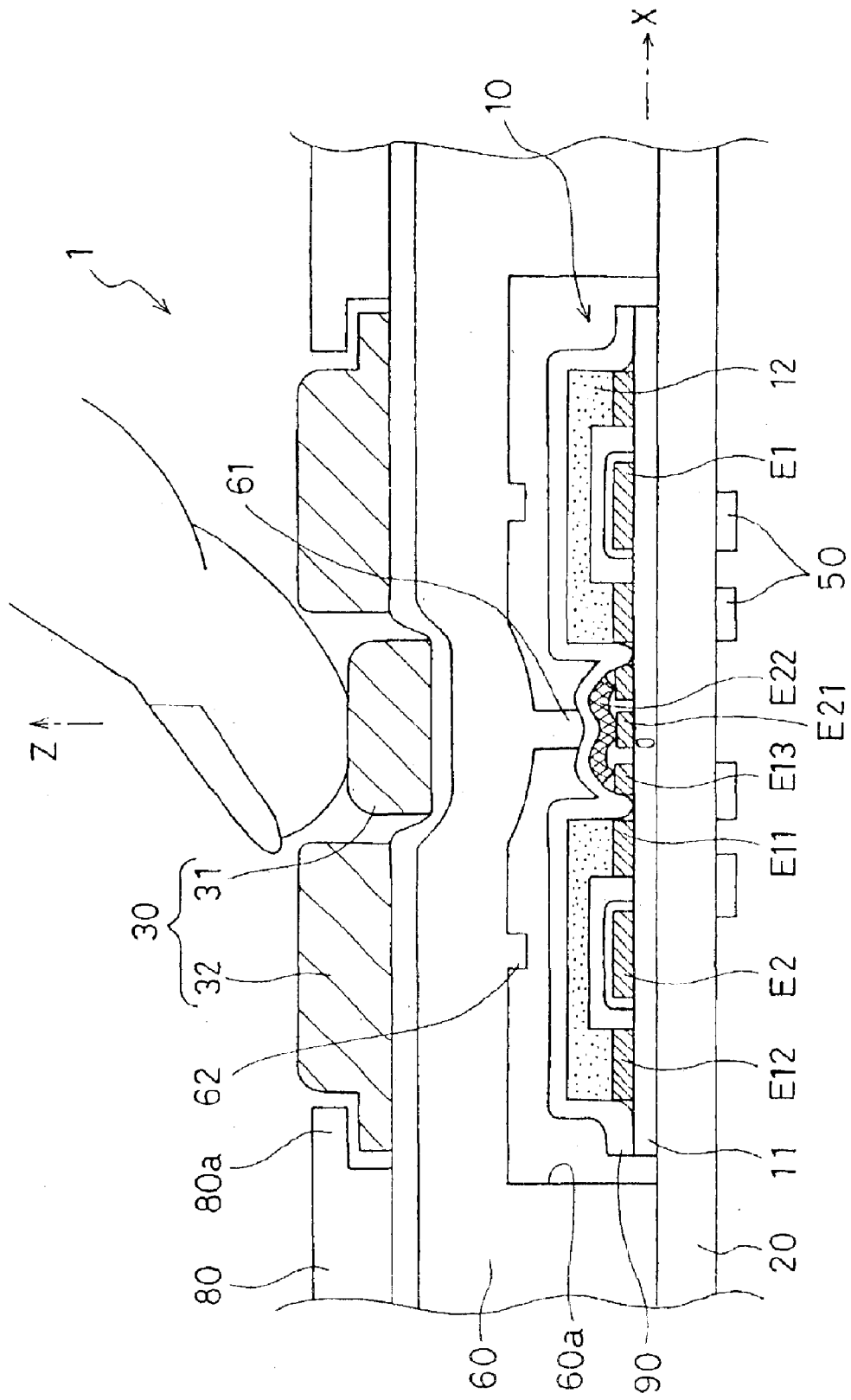
FIG. 8 is a schematic cross-sectional side view of the capacitance type sensor shown in FIG. 1 when a central button is operated.

Reference is now made to operation of the capacitance type sensor 1 according to the illustrated embodiment thus constructed with reference to the drawings. FIG. 7 is a schematic cross-sectional side view of the capacitance type sensor shown in FIG. 1 when the direction button is operated in the X-axis positive direction. FIG. 8 is a schematic cross-sectional side view of the capacitance type sensor shown in FIG. 1 when the central button is operated.

First of all, let us consider the case where the direction button 32 is operated in the X-axis positive direction in the state of FIG. 1 in which no force is applied to the detective button 30, as shown in FIG. 7, in other words, the case where a force to press down the direction button 32 toward the substrate 20 (a force acting in the Z-axis negative direction) is applied to the direction button 32 from the arrow for the X-axis positive direction formed on the upper portion 32a of the direction button 32.

By pressing down the corresponding portion of the direction button 32 to the X-axis positive direction, the supporting member 60 and the resin sheet 70 are elastically deformed and, as a result, the protrusion 62 of the supporting member 60 corresponding to the X-axis positive direction is displaced downwardly. When the protrusion 62 is pressed down to an extent corresponding to a specified height, the front end of the protrusion 62 is brought into contact with the resin sheet 90 laid over the displacement electrode 12 and, as a result, the downward force is exerted on the displacement electrode 12 proximity of its portion corresponding to the protrusion 62. As seen from above, when the direction button 32 is operated, the displacement electrode 12 is not displaced until the protrusion 62 is pressed down to an extent corresponding to a specified height to bring the front end of the protrusion 62 into contact with the resin sheet 90 laid over the displacement electrode 12.

Sequentially, when the direction button 32 is pressed down further, the supporting member 60, the resin sheet 70 and the displacement electrode 12 are elastically deformed further and, as a result, the related portion of the displacement electrode 12 is displaced downward. Thus, the distance between the displacement electrode 12 and the capacitance element electrode E1 is reduced. In general, the capacitance value of the capacitance element is in inverse proportion to the distance between the electrodes forming the capacitance element. Accordingly, the capacitance value of the capacitance element C1 increases inversely as the distance therebetween.

Therefore, when the direction button 32 is operated in the X-axis positive direction, only the capacitance element C1 out of the capacitance elements C1–C4 that varies in the distance between the displacement electrode 12 and the capacitance element electrode E1–E4 varies in capacitance value. At this time, as detailed later, a cyclic signal A input to the terminal T1 passes through a delay circuit including the capacitance element C1 and thereby a phase lag is produced. An output signal Vx is derived by reading the phase lag.

At this time, the distances between the displacement electrode 12 and the capacitance element electrodes E2–E4 do not vary virtually and, accordingly, the capacitance value of the capacitance elements C2–C4 do not vary. Due to this, no phase lag is produced by the cyclic signal passing through the delay circuits including the capacitance elements C2–C4. When the direction button 32 is operated in the X-axis positive direction, the capacitance value of the capacitance elements C2–C4 may vary, depending on the positional relationship between the direction button 32 and the protrusion 62 of the supporting member 60, but such a variation is small, as compared with the variation of the capacitance value of the capacitance element C1.

Next, let us consider the case where the central button 31 is operated in the state of FIG. 1 in which no force is applied to the detective button 30, as shown in FIG. 8, in other words, the case where a force to press down the central button 31 toward the substrate 20 (a force acting in the Z-axis negative direction) is applied to the central button 31.

By pressing down the central button 31, the supporting member 60 and the resin sheet 70 are elastically deformed and, as a result, the protrusion 61 of the supporting member 60 corresponding to the fixed decision switch electrode E21 is displaced downwardly. When the protrusion 61 is pressed down to an extent corresponding to a specified height, the front end of the protrusion 61 is brought into contact with the resin sheet 90 laid over the movable decision switch electrode E22 and, as a result, the downward force is exerted on the movable decision switch electrode 22 proximity of its top. As seen from above, when the central button 31 is operated, the movable decision switch electrode E22 is not displaced until the protrusion 61 is pressed down to an extent corresponding to a specified height to bring the front end of the protrusion 61 into contact with the resin sheet 90 laid over movable decision switch electrode E22.

When the force does not reach a specified value, the movable decision switch electrode E22 does not vary virtually. On the other hand, when the force reaches the specified value, a top portion of the movable decision switch electrode E22 is elastically deformed drastically with buckling and is depressed to bring the movable decision switch electrode E22 into contact with the fixed decision switch electrode E21. As a result of this, the decision switch S2 is switched from OFF mode to ON mode. At this time, a pronounced tactile feel is given to the operator.

Figure 9:
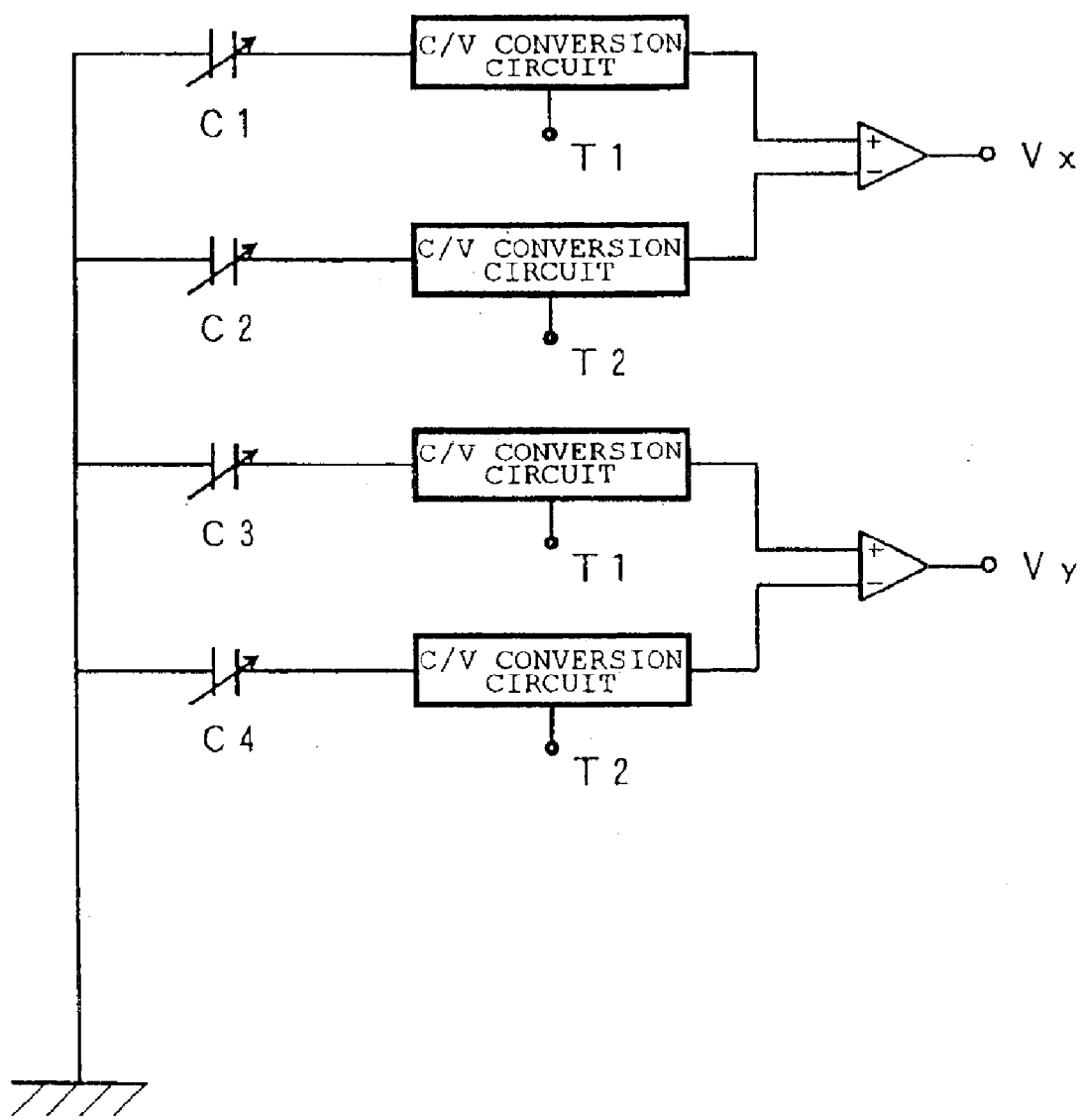
FIG. 9 is an illustration for explaining the way of deriving an output signal from a cyclic signal input to the capacitance type sensor shown in FIG. 1.

Next, reference is made to the way of deriving an output signal showing magnitude and direction of a force applied from outside to the direction button 32 of the detective button 30 from variations of the capacitance value of the capacitance elements C1–C4, with reference to FIGS. 9–12. FIG. 9 is an illustration for explaining the way of deriving an output signal from a cyclic signal input to the capacitance type sensor shown in FIG. 1. It is to be noted that variations of the output signals Vx, Vy indicate the magnitude and direction of an X-axis direction component of a force applied from outside and the magnitude and direction of a Y-axis direction component of the force applied from outside, respectively.

In order to derive the output signals Vx, Vy, cyclic signals, such as clock signals, are input to the terminals T1, T2. When the direction button 32 is displaced by a force from outside in the state in which the cyclic signals are being input to the terminals T1, T2, the displacement electrode 12 is displaced in the Z-axis negative direction in response thereto and the distance between the electrodes of each of the capacitance elements C1–C4 varies and thereby the capacitance value of each of the capacitance elements C1–C4 varies. Then, phase lags in the cyclic signals input to the terminals T1, T2 are produced. By using the phase lags produced in the cyclic signal, the output signals Vx, Vy can be obtained which show the displacement of the direction button 32, i.e., the magnitude and direction of the X-axis direction component of the force applied to the direction button 32 from outside and the magnitude and direction of the Y-axis direction component of the force applied thereto from outside, respectively.

In further detail, when the cyclic signal A is input to the terminal T1, a cyclic signal B of identical in periodicity with but different in phase from the cyclic signal A is input to the terminal T2. When the capacitance value of the capacitance elements C1–C4 vary by a force applied to the direction bottom 32 from outside at that time, a phase lag is produced in at least either of the cyclic signal A input to the terminal T1 and the cyclic signal B input to the terminal T2. Specifically, when the capacitance value of the capacitance elements C1, C3 vary, a phase lag is produced in the cyclic signal A input to the terminal T1. On the other hand, when the capacitance value of the capacitance elements C2, C4 vary, a phase lag is produced in the cyclic signal B input to the terminal T2.

When a force applied from outside includes an X-axis direction component, either the capacitance value of the capacitance element C1 varies to thereby produce the phase lag in the cyclic signal A input to the terminal T1 or the capacitance value of the capacitance element C2 varies to thereby produce the phase lag in the cyclic signal B input to the terminal T2, or both of them. The variations of the capacitance value of the capacitance elements C1, C2 correspond to the X-axis positive direction component of the force from outside and the X-axis negative direction component of the force from outside, respectively. The phase lag in the cyclic signal A input to the terminal T1 and the phase lag in the cyclic signal B input to the terminal T2 are read, for example, by an exclusive-OR gate or equivalent to derive the output signal Vx. A sign for variation of the output signal Vx indicates whether a component of a force from outside is of an X-axis positive direction or an X-axis negative direction, and an absolute value of variation of the output signal Vx indicates a magnitude of the X-axis direction component of the force.

When a force applied from outside includes a Y-axis direction component, either the capacitance value of the capacitance element C3 varies to thereby produce the phase lag in the cyclic signal A input to the terminal T1 or the capacitance value of the capacitance element C4 varies to thereby produce the phase lag in the cyclic signal B input to the terminal T2, or both of them. The variations of the capacitance value of the capacitance elements C3, C4 correspond to the Y-axis positive direction component of the force from outside and the Y-axis negative direction component of the force from outside, respectively. The phase lag in the cyclic signal A input to the terminal T1 and the phase lag in the cyclic signal B input to the terminal T2 are read, for example, by the exclusive-OR gate or equivalent to derive the output signal Vy. A sign for variation of the output signal Vy indicates whether a component of a force from outside is of a Y-axis positive direction or a Y-axis negative direction, and an absolute value of variation of the output signal Vy indicates a magnitude of the Y-axis direction component of the force.

Figure 10:
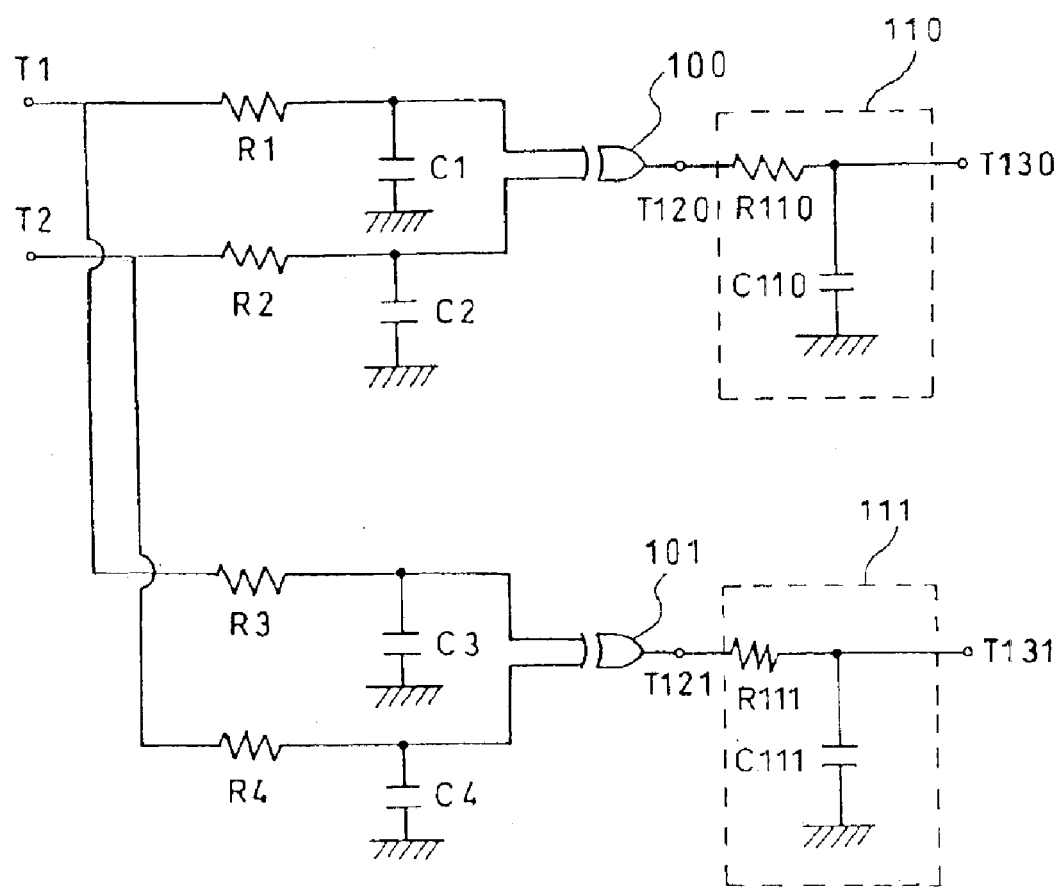
FIG. 10 is a circuit diagram showing a signal processing circuit of the capacitance type sensor shown in FIG. 1.

Next, reference is made to a signal processing circuit for deriving the output signals Vx, Vy by using the cyclic signals A, B input to the terminals T1, T2, with reference to FIG. 10. FIG. 10 is a circuit diagram showing a signal processing circuit of the capacitance type sensor shown in FIG. 1.

Resistance elements R1, R3 are connected to the terminal T1, and resistance elements R2, R4 are connected to the terminal T2. An EX-OR element 100 which is a logic element of the exclusive-OR gate is connected to output ends of the resistance elements R1, R2, and an EX-OR element 101 is connected to output ends of the resistance elements R3, R4. The output ends are connected to their respective terminals T120, T121. Low-pass filters (smoothing circuit) 110, 111 are connected to the terminals T120, T121, respectively, and the output ends are connected to the terminals T130, T131, respectively. The output ends of the resistance elements R1–R4 are connected to the capacitance element electrodes E1–E4, respectively. The capacitance elements C1–C4 are formed between the capacitance element electrodes and the displacement electrode 12. The displacement electrode 12 is connected to ground through the terminals T11, T12.

The low-pass filters 110, 111 are used for converting the output signal Vx output from the EX-OR elements 100, 101 into analog voltage Vx'. Variation of the capacitance value of each of the capacitance elements C1–C4 is detected as variation of a duty ratio of waveform of the output signal Vx before input to the low-pass filters 110, 111. The signal is smoothed by passing through the low-pass filters 110, 111 and the duty ratio is converted to a voltage value, for use of it. The low-pass filter 110 is formed by the resistance elements R110 and the capacitance elements C110, and the low-pass filter 111 is formed by the resistance elements R111 and the capacitance elements C111. One of the two electrodes of the capacitance element C110, C111 that is not connected to the resistance element R110, R111 is connected to ground.

Thus, after the output signals Vx output from the EX-OR elements 100, 101 to the terminals T120, T121 are smoothed by passing through the low-pass filters 110, 111, the smoothed output signals Vx are output as the analog voltage Vx' to the terminals T130, T131. A value of the analog voltage Vx' varies in proportion to the duty ratio of the output signal Vx. Therefore, with an increase in the duty ratio of the output signal Vx, the value of the analog voltage Vx' increases. On the other hand, with a decrease in the duty ratio of the output signal Vx, the value of the analog voltage Vx' decreases. When the duty ratio of the output signal Vx does not vary virtually, the value of the analog voltage Vx' does not vary virtually, either.

Figure 11:
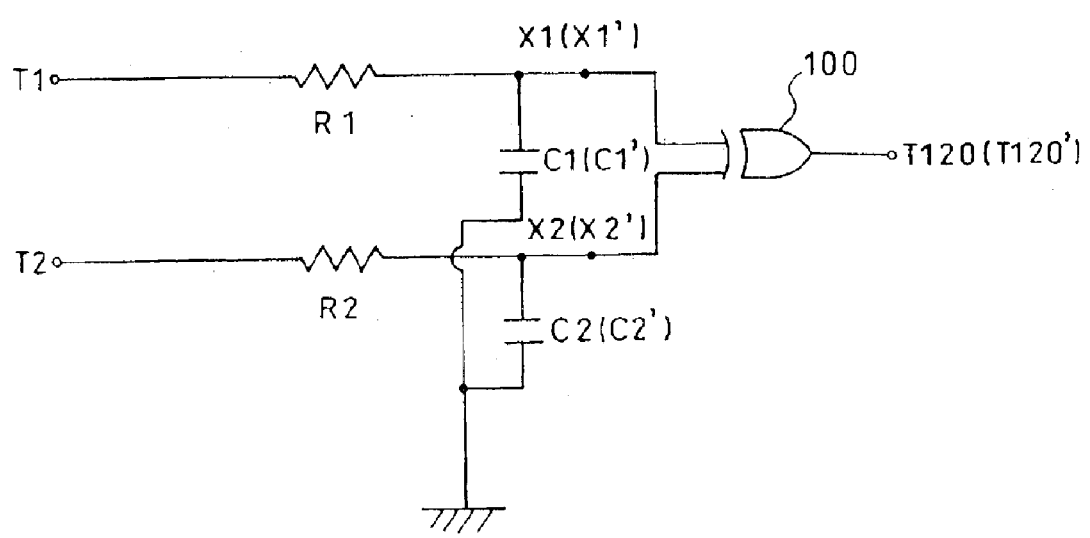
FIG. 11 is a circuit diagram showing a signal processing circuit for components for the X-axis direction of the capacitance type sensor shown in FIG. 1.
Figure 12:
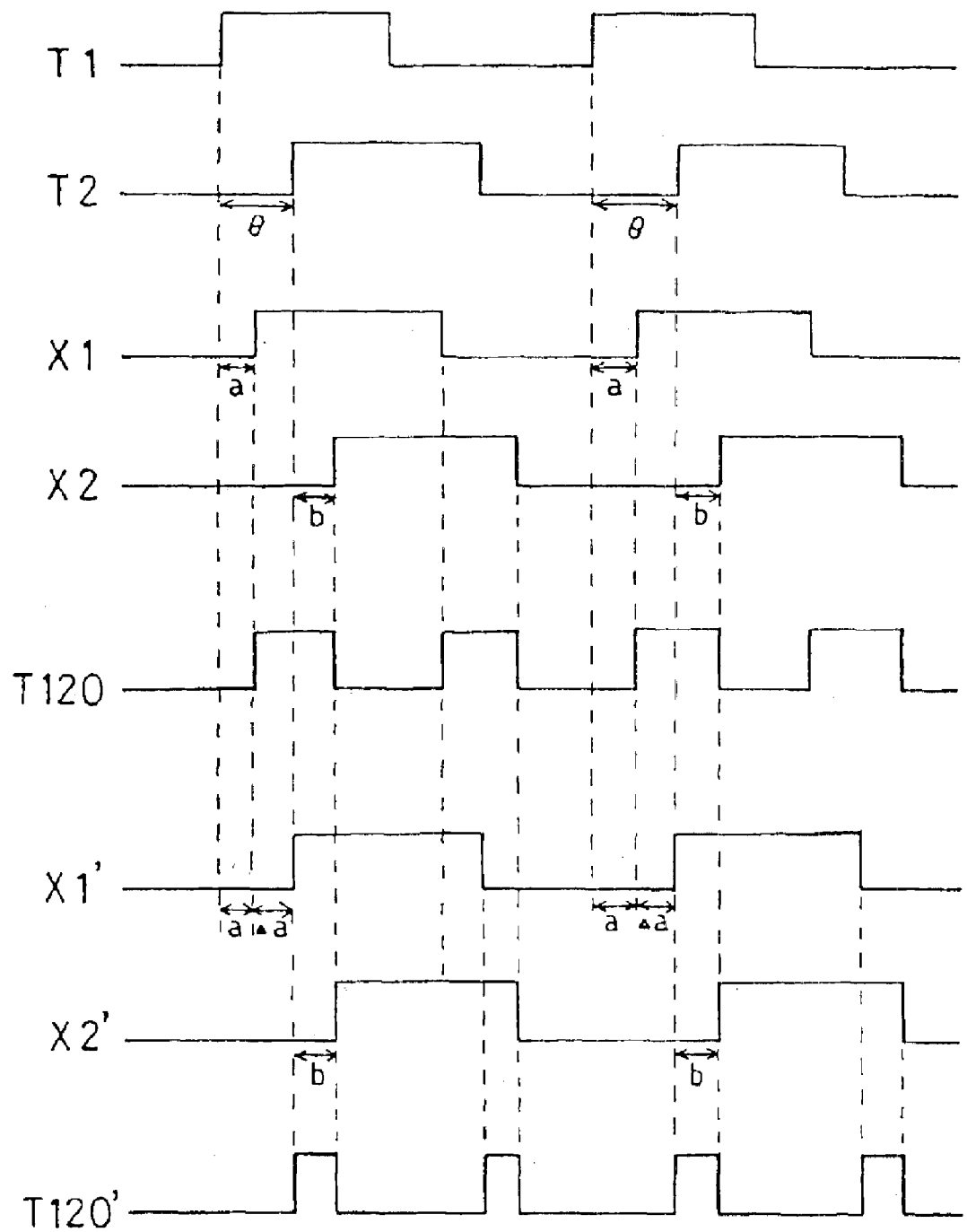
FIG. 12 is a view showing a waveform of a cyclic signal at each terminal and each node of the signal processing circuit shown in FIG. 11.

Reference is made herefrom to the way of deriving the output signal Vx of the X-axis direction component, with reference to FIGS. 11 and 12. FIG. 11 is a circuit diagram (a part of FIG. 10) showing a signal processing circuit for components for the X-axis direction of the capacitance type sensor shown in FIG. 1. FIG. 12 is a view showing a waveform of a cyclic signal at each terminal and each node of the signal processing circuit shown in FIG. 11. Since the way of deriving the output signal Vy of the Y-axis direction component is the same as the way of deriving the output signal Vx of the X-axis direction component, the detailed explanation thereof is omitted.

In the signal processing circuit of FIG. 11, the capacitance element C1 and the resistance element R1, and the capacitance element C2 and the resistance element R2 form CR delay circuits, respectively. Accordingly, the cyclic signals (rectangular-wave signal) input to the terminals T1, T2 are delayed to a specific extent by the respective CR delay circuits and then are input to the EX-OR element 100.

In more detail, a cyclic signal f (Φ) (which corresponds to the cyclic signal A noted above) is input to the terminal T1, and a cyclic signal f (Φ+θ) (which corresponds to the cyclic signal B noted above) identical in periodicity with but different in phase from the cyclic signal f (Φ) by θ only is input to the terminal T2. The cyclic signal f (Φ) input to the terminal T1 passes through the CR delay circuit formed by the capacitance element C1 and the resistance element R1 and reaches the node X1. This introduces a delay of time a in the cyclic signal at the node X1, as shown in FIG. 12. Likewise, the cyclic signal f (Φ+θ) input to the terminal T2 passes through the CR delay circuit formed by the capacitance element C2 and the resistance element R2 and reaches the node X2. This introduces a delay of time b in the cyclic signal at the node X2.

The cyclic signal f (Φ) and the cyclic signal f (Φ+θ) of different in phase from f (Φ) which are input to the terminals T1 and T2 respectively are generated by dividing the cyclic signals output from a single cyclic signal oscillator two routes and introducing the phase lags in the cyclic signals passing through the CR delay circuit (not shown) arranged in one of the two routes. The way of introducing the phase lags in the cyclic signals is not limited to the way using the CR delay circuit. Any other adequate ways may be used. The cyclic signals f (Φ) and f (Φ+θ) of different in phase from each other may be generated by using two cyclic signal oscillators and then input to the terminals T1 and T2, respectively.

The time a, b correspond to delay time in the CR delay circuit and are determined by their respective time constants of the CR delay circuit. Accordingly, if the resistance elements R1, R2 have the same resistance value, the time a, b will correspond to the capacitance value of the capacitance elements C1, C2. That is to say, with an increase in the capacitance value of the capacitance elements C1, C2, the value of the time a, b increases, and with a decrease in the capacitance value of the capacitance elements C1, C2, the value of the time a, b decreases.

Thus, the signals having the same waveform as the cyclic signals at the nodes X1, X2 are input to the EX-OR element 100, for an exclusive-OR logical operation between those signals and then the result is output to the terminal T120. It should be noted that the signal output to the terminal T120 is a rectangular-wave signal having a specified duty ratio (See FIG. 12).

Figure 13:
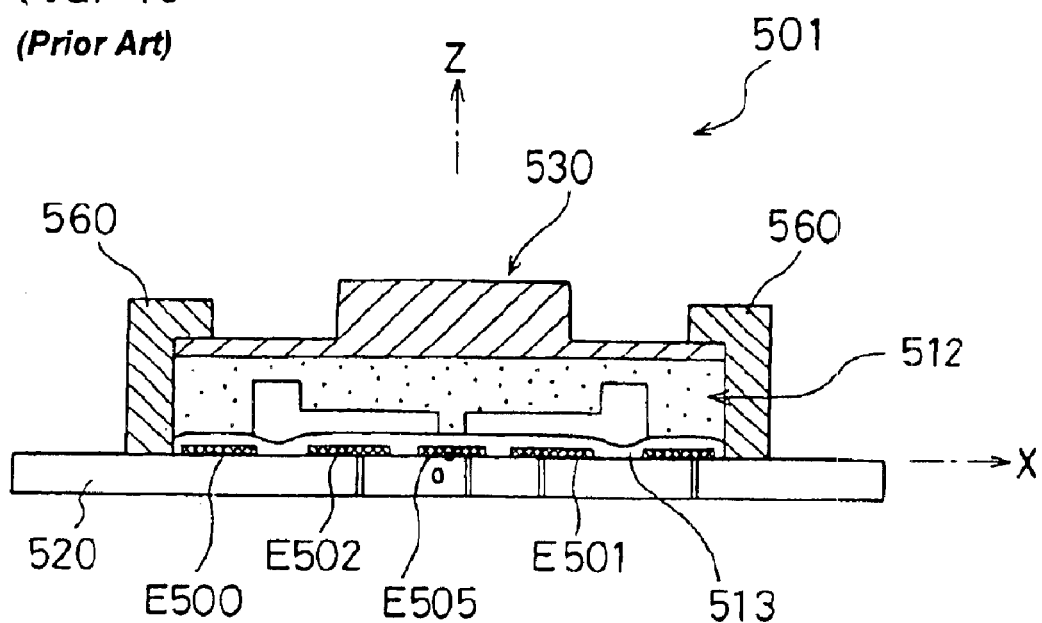
FIG. 13 is a schematic sectional view of a conventional capacitance type sensor.
Figure 14:
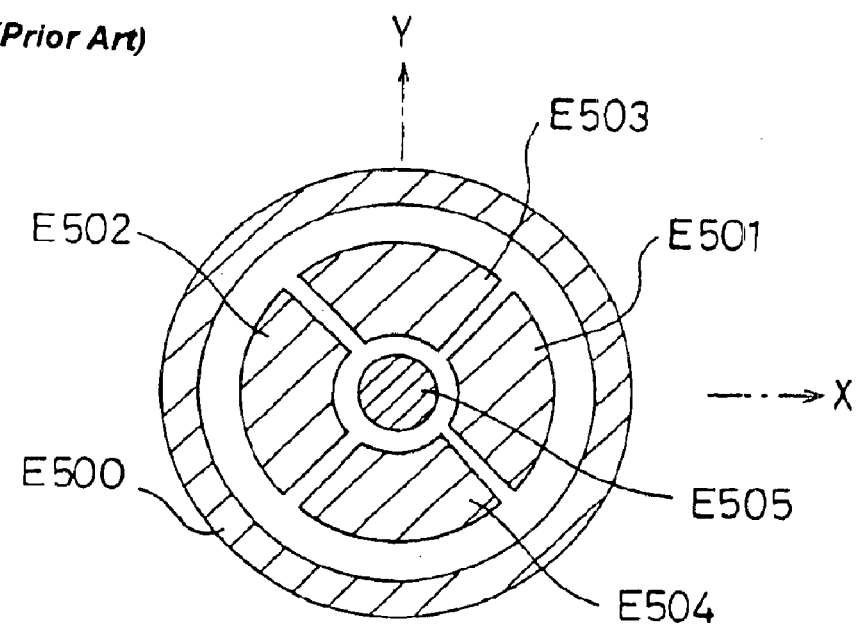
FIG. 14 is a view showing an arrangement of a plurality of electrodes formed on a substrate of the conventional capacitance type sensor of FIG. 13.

Now, let us consider the waveform of the cyclic signals at the respective terminals and nodes appearing when the direction button 32 is operated in the X-axis positive direction (See FIG. 7). The capacitance elements formed between the capacitance element electrodes E1, E2 and the displacement electrode 12 of the signal processing circuit are taken here as C1', C2'. Also, the nodes and the terminals corresponding in position to the nodes X1, X2 and the terminal T120 of the signal processing circuit when the direction button 32 is not operated are taken here as X1', X2', and T120', respectively (See FIG. 13).

At this time, in the signal processing circuit of FIG. 11, the cyclic signal f (Φ) is input to the terminal T1 and the cyclic signal f (Φ+θ) of identical in periodicity with but different in phase from f (Φ) by θ is input to the terminal T2, as is the case with the above. The cyclic signal f (Φ) input to the terminal T1 passes through the CR delay circuit formed by the capacitance element C1' and the resistance element R1 and reaches the node X1'. This introduces a delay of time a+Δa in the cyclic signal at the node X1', as shown in FIG. 12. This is because the time constant of the CR delay circuit is increased with the capacitance value of the capacitance element C1' becoming larger than that of the capacitance element C1. On the other hand, the cyclic signal f (Φ+θ) input to the terminal T2 passes through the CR delay circuit formed by the capacitance element C2' and the resistance element R2 and reaches the node X2'. At this time, the cyclic signal at the node X2' has the same waveform as the cyclic signal at the node X2, since no force is applied to the direction button 32 in the X-axis negative direction.

Thus, the signals having the same waveform as the cyclic signals at the nodes X1', X2' are input to the EX-OR element 100, for an exclusive-OR logical operation between those signals and then the result is output to the terminal T120'. It should be noted that the signal output to the terminal T120' is a rectangular-wave signal having a specified duty ratio and when the direction button 32 is not operated, it is a rectangular-wave signal having a smaller duty ratio than the rectangular-wave signal output to the terminal T120.

Practically, the signals to be output to the terminals T120 and T120' are output after they are smoothened by the low-pass filter 110, as mentioned above.

The capacitance type sensor 1 of the illustrated embodiment is intended for use as a force sensor and is preferably used as an input device joystick) of a mobile phone, a personal digital assistant (PDA), a personal computer, a game, and the like. The capacitance type sensor 1 of the illustrated embodiment may be used as other sensors, such as an acceleration sensor, than the force sensor. In this case also, the same effect can be provided.

As seen from the foregoing, according to the capacitor type sensor 1 of the illustrated embodiment, since a specified space is defined between the supporting member 60 for supporting the detective button 30 and the displacement electrode 12, the displacement electrode 12 is not displaced until the detective button 30 is displaced to an extent corresponding to a specified space. Accordingly, even if there is difference between an initial position of the detective button 30 before operation and a returned position of the same after operation, a possible occurrence of difference of the returned position of the displacement electrode 12 from the original position of the same is prevented. Therefore, the output signal from the capacitance type sensor before operation of the detective button 30 and the output signal from the capacitance type sensor after operation of the detective button 30 become substantially the same. This can provide a relatively reduced hysteresis of the output signal from the capacitance type sensor 1, thus providing improved reproducibility for the sensor. In addition, since the displacement electrode 12 is not displaced until the detective button 30 is pressed down (displaced) to an extent corresponding to the specified space by an operator's will, occurrence of errors (malfunctions) of the sensor is suppressed.

Also, since the supporting member 60 for supporting the detective button 30 is provided with the protrusions 62 corresponding in position to the capacitance element electrodes E1–E4, the corresponding portions of the displacement electrode 12 to the capacitance element electrodes E1–E4 can be effectively displaced.

Further, by arranging the capacitance element electrodes E1–E4 and the displacement electrode 12 on the single FPC 11, the sensor part can be assembled with the detective button 30 after the sensor part is formed as a unit (unitized). Therefore, even when the detective button 30 is modified in shape and size, the capacitance property of the capacitance element does not substantially vary depending on an operating force applied to the detective button 30. This can provide the following advantage for the case of the capacitance type sensor 1 placed on equipment such as a mobile phone. That is to say, even when an external appearance of the sensor or a shape of the detective button 30 is modified, since the sensor part formed as a unit is commonly used, there is no need to readjust the control circuit and software in consideration of the user-friendly operation of the joystick each time that equipment is remodeled.

Also, since the sensor part is formed as a unit, the performance of the sensor part itself can be checked in advance of the assembly of the sensor part with other parts being completed. This can allow the sensor part having the capacitance values of a specified range (conforming article) to be selected by checking the capacitance elements in the sensor part in advance on the magnitude of the capacitance values and the like for each unit. As a result, generation of defective products as the sensor can be prevented, thus producing improved yield of the sensor.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

Although the sensor unit 10 wherein for example the capacitance element electrodes E1–E4 and the displacement electrode 12 are formed as a unit on the upper surface of the FPC 11 has been illustrated in the embodiment described above, this is not limitative. Those electrodes are not necessarily formed as a unit. The capacitance element electrodes and the displacement electrode may be supported independently on the substrate. Further, the defective button arranged to define the specified space between the detective button and the displacement electrode may be supported on the supporting member.

Although the structure wherein the tapered protrusions 62 serving as pressing members are formed on surfaces of the supporting member opposite to the displacement electrode 12 so as to protrude toward the displacement electrode 12 has been illustrated in the embodiment described above, this is not limitative. The protrusions may be varied in shape arbitrarily. Also, the protrusions may be formed on surfaces of the displacement electrode opposite to the supporting member (detective button) so as to protrude toward the supporting member. Thus, as long as the specific portion of the displacement electrode can be displaced intensively in the space between the supporting member for supporting the direction button and the displacement electrode when the direction button is operated, the configuration of the protrusions may be varied arbitrarily. Also, the pressing members may be formed by a different member from the supporting member and displacement electrode, in addition to the pressing members being formed by the protrusions formed to protrude from one of the supporting member and the displacement electrode toward the other.

Although the structure wherein two reference electrodes E11, E12 are provided on the FPC 11 in order to connect the displacement electrode 12 to ground has been illustrated in the embodiment described above, there may be provided only either of the reference electrodes E11, E12.

Although the structure wherein there is provided the decision switch S1 has been illustrated in the embodiment described above, the decision switch is not indispensable. In this variant, the central button 31, the fixed decision switch electrode E21, the movable decision switch electrode E22 and the reference electrode E13 are unnecessary.

Although the capacitance type sensor 1 capable of detecting two components of a force applied to the direction button 32 from outside for the X-axis direction and the Y-axis direction has been illustrated in the embodiment described above, this is not limitative. The capacitance type sensor 1 may be formed to detect only one required component out of the two components of the force.

What is claimed is:

1. A capacitance type sensor comprising:
   a detective member configured to detect an external force applied thereto;

a first electrode facing the detective member and a second electrode disposed between the detective member and the first electrode such that a capacitance element is formed by the first electrode and the second electrode, the second electrode being displaceable in a direction of displacement of the detective member when the detective member is displaced, wherein a specified space is defined between the detective member and the second electrode, whereby the second electrode is not displaced until the detective member is displaced to an extent corresponding to the specified space, and wherein the capacitance type sensor identifies the displacement of the detective member on the basis of a detection, using a signal input to the first electrode, of a change in capacitance of the capacitance element caused by a change in distance between the first electrode and the second electrode.

2. The capacitance type sensor according to claim 1, which has at least one tapered pressing member disposed in the specified space.

3. The capacitance type sensor according to claim 2, which further comprises a first substrate on which the first electrode and the second electrode are both provided.

4. The capacitance type sensor according to claim 3, further comprising:

a second substrate mounting the first substrate thereon; and a supporting member disposed on the second substrate and configured to support the detective member.

5. The capacitance type sensor according to claim 3, wherein another specified space is defined between the second electrode and the second supporting member.

6. The capacitance type sensor according to claim 3, wherein the first substrate is a flat-plate-like member.

7. The capacitance type sensor according to claim 3, further comprising:

a third electrode disposed on the first substrate;

a reference electrode disposed on the first substrate and grounded at a predetermined electrical potential; and a fourth electrode electrically connecting the reference electrode and configured in a spaced relation to the third electrode, wherein the fourth electrode contacts with the third electrode by elastic deformation thereof based on the displacement of the detective member.

8. The capacitance type sensor according to claim 7, wherein the detective member comprises separate members corresponding to the second electrode and the fourth electrode respectively.

9. The capacitance type sensor according to claim 1, which further comprises a first substrate on which the first electrode and the second electrode are both provided.

10. The capacitance type sensor according to claim 9, further comprising:

a second substrate mounting the first substrate thereon; and a supporting member disposed on the second substrate and configured to support the detective member.

11. The capacitance type sensor according to claim 9, wherein another specified space is defined between the second electrode and the second supporting member.

12. The capacitance type sensor according to claim 9, wherein the first substrate is a flat, plate-like member.

13. The capacitance type sensor according to claim 9, further comprising:

a third electrode disposed on the first substrate;

a reference electrode disposed on the first substrate and having a predetermined electrical potential; and a fourth electrode electrically connecting the reference electrode and configured in a spaced relation to the third electrode, wherein the fourth electrode contacts with the third electrode by elastic deformation thereof based on the displacement of the detective member.

14. The capacitance type sensor according to claim 13, wherein the detective member comprises separate members corresponding to the second electrode and the fourth electrode, respectively.

15. A capacitance type sensor comprising:

a substrate;

a first electrode disposed on the substrate;

a second electrode facing and spaced from the first electrode such that the first electrode and the second electrode serve as a capacitor;

a supporting member disposed on the substrate; and a detective member configured to be supported by the supporting member and displaceable by an external force, wherein displacement of the detective member causes the second electrode to be displaced, and wherein a specified space is defined between the detective member and the second electrode such that the displacement of the detective member is offset by the specified space.

\* \* \* \* \*